(12) United States Patent
Braganca et al.

(10) Patent No.: US 8,164,861 B2
(45) Date of Patent: Apr. 24, 2012

(54) SPIN TORQUE OSCILLATOR SENSOR EMPLOYING ANTIPARALLEL COUPLED OSCILATION LAYERS

(75) Inventors: Patrick M. Braganca, San Jose, CA (US); Bruce A. Gurney, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 329 days.

(21) Appl. No.: 12/636,108

(22) Filed: Dec. 11, 2009

(65) Prior Publication Data

US 2011/0141629 A1 Jun. 16, 2011

(51) Int. Cl.
*G11B 5/39* (2006.01)
(52) U.S. Cl. ...................................... 360/313
(58) Field of Classification Search .................. 360/313, 360/324.1, 324.11, 324.12, 324.2
See application file for complete search history.

(56) References Cited

U.S. PATENT DOCUMENTS

| | | | |
|---|---|---|---|
| 2008/0019040 A1* | 1/2008 | Zhu et al. | 360/110 |
| 2009/0168269 A1* | 7/2009 | Carey et al. | 360/324.11 |
| 2009/0168501 A1* | 7/2009 | Ito | 365/158 |
| 2009/0250775 A1* | 10/2009 | Delaet et al. | 257/421 |
| 2010/0033881 A1* | 2/2010 | Carey et al. | 360/324.11 |
| 2010/0034017 A1* | 2/2010 | Rivkin et al. | 365/171 |
| 2010/0079919 A1* | 4/2010 | Nagasawa et al. | 360/324.1 |

* cited by examiner

*Primary Examiner* — Jefferson Evans
(74) *Attorney, Agent, or Firm* — Zilka-Kotab, PC

(57) ABSTRACT

A spin torque magnetoresistive sensor having a very small gap thickness. The sensor operates by measuring the change in frequency of a spin torque induced magnetic oscillation in magnetic layers of the sensor to detect the presence of a magnetic field. The sensor includes a pair of free magnetic layers that are antiparallel coupled by a thin non-magnetic coupling layer there-between. The sensor does not include a pinned layer structure nor an associated AFM pinning layer, which allows the sensor to be constructed much thinner than prior art sensors.

25 Claims, 11 Drawing Sheets

SPIN TORQUE OSCILLATOR SENSOR EMPLOYING ANTIPARALLEL COUPLED OSCILATION LAYERS

FIELD OF THE INVENTION

The present invention relates to magnetic heads for data recording, and more particularly to a sensor that uses spin torque induced magnetic oscillation variation to detect a magnetic field.

RELATED APPLICATIONS

The present invention is related to commonly assigned U.S. patent application Ser. No. 12/492,050, filed on Jun. 25, 2009, entitled SPIN TORQUE OSCILLATOR SENSOR, which is incorporated herein by reference.

BACKGROUND OF THE INVENTION

The heart of a computer's long term memory is an assembly that is referred to as a magnetic hard disk drive. The magnetic hard disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk, and when the disk rotates, air adjacent to the disk moves along with the surface of the disk. The slider flies over the surface of the disk on a cushion of this moving air. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

The write head has traditionally included a coil that passes through a magnetic yoke that includes a write pole and a return pole. Current conducted to the coil layer induces a magnetic flux in the pole pieces which causes a write field to emit from the write pole for the purpose of writing a magnetic transition in tracks on the moving media, such as in circular tracks on the rotating disk.

Traditionally a sensor such as a GMR or TMR sensor has been employed for sensing magnetic fields from the rotating magnetic disk. Such sensors use a spin valve magnetic design, including a nonmagnetic conductive spacer layer, or nonmagnetic insulating barrier layer, sandwiched between first and second ferromagnetic layers, referred to as a pinned or reference layer and a free layer. First and second leads are connected to the sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

When the magnetizations of the pinned and free layers are parallel with respect to one another, conduction or tunneling of electrons through the stack of layers is maximized and when the magnetizations of the pinned and free layer are antiparallel, overall conductivity is reduced. Changes in conduction or tunneling alter the resistance of the spin valve sensor substantially in proportion to cos θ, where θ is the angle between the magnetizations of the pinned and free layers. When reading stored information the resistance of the sensor changes approximately proportionally to the magnitude of the magnetic fields from the rotating disk. When a sense current flows through the spin valve sensor, resistance changes cause potential changes that are detected and processed as playback signals.

In order to increase data density, manufacturers always strive to decrease the size of magnetoresistive sensors. For example, decreasing the track width of the sensor to fit more data tracks on the disk and decreasing the gap thickness of the sensor to increase linear data density. However, as spin valve sensors become ever smaller they reach a point where sensor instability and noise make the sensors impractical to achieve sufficiently high signal to noise over the required bandwidth for recording. For example, magnetic noise, resulting from the fluctuations of the ferromagnetic layers caused by temperature, can decrease the signal to noise ratio of a very small sensor to the point that such a sensor cannot effectively be used to read a signal with sufficient certainty. In magnetic tunnel junction sensors, an additional noise resulting from shot noise further increases the noise, thereby decreasing the overall signal to noise and making MTJ sensors unsuitable for ultra high density recording. Therefore, there is a continuing need for a sensor design that can be made very small for reading at very high data densities.

SUMMARY OF THE INVENTION

The present invention provides a spin torque oscillation magnetoresistive sensor that includes first and second magnetic layers and a non-magnetic layer sandwiched between the first and second magnetic layers, the non-magnetic layer having a thickness sufficient to antiparallel couple the first and second magnetic layers. The sensor also includes circuitry for passing a sense current through the first and second magnetic layers and the spacer layer. The sense current excites spin torque induced oscillations in the magnetizations of the first and second magnetic layers, where the oscillation frequency changes in response to the presence of a magnetic field.

The magnetic layers are not pinned but have magnetizations that are free to oscillate as a result of spin torque from electrons passing there-through. The sensor achieves a very small gap thickness by eliminating the need for a pinned layer structure and eliminating the need for an associated AFM pinning layer.

When current of appropriate signal and magnitude passes through the layers of the sensor, spin torque forces cause the magnetizations of the magnetic layers to oscillate in a precessional manner. The frequency of this oscillation changes in response to the presence of a magnetic field. The oscillations cause the magnetizations to move relative to one another which causes a change in resistance across the sensor. By measuring this change in resistance, the circuitry attached to the sensor can determine the change in frequency of the oscillations and thereby detect the presence of the magnetic field.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE EMBODIMENTS

The following description is of the best embodiments presently contemplated for carrying out this invention. This description is made for the purpose of illustrating the general principles of this invention and is not meant to limit the inventive concepts claimed herein.

Figure 1:
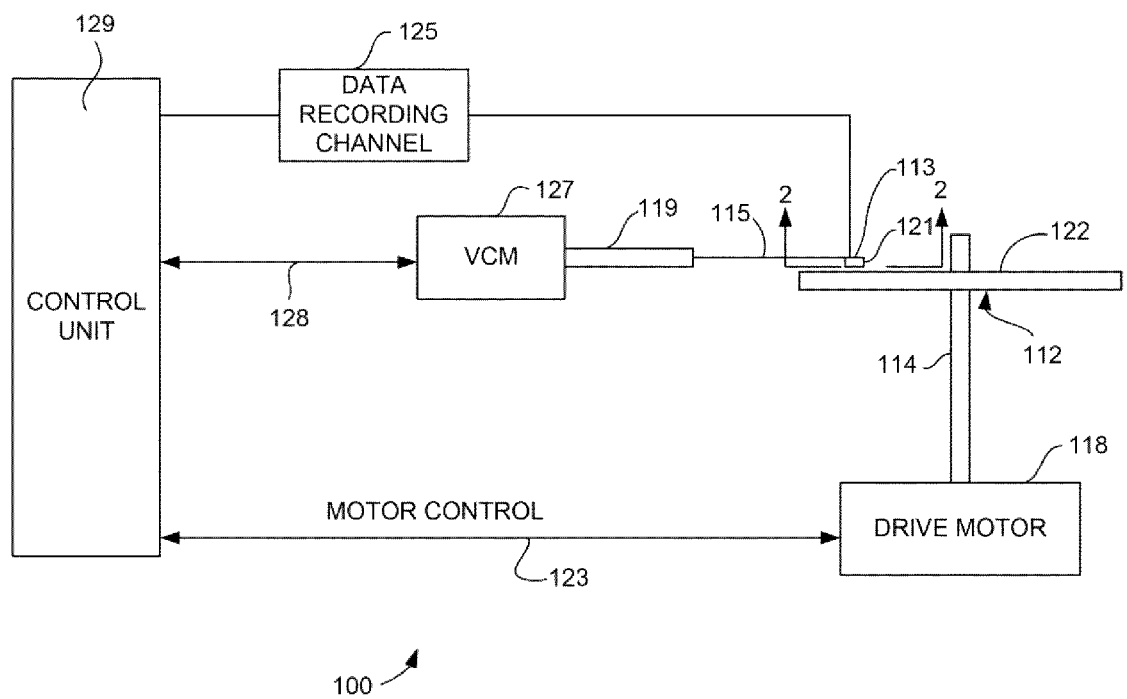
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts a force on the slider. The air bearing thus counter-balances the slight spring force of suspension 115 and supports the slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
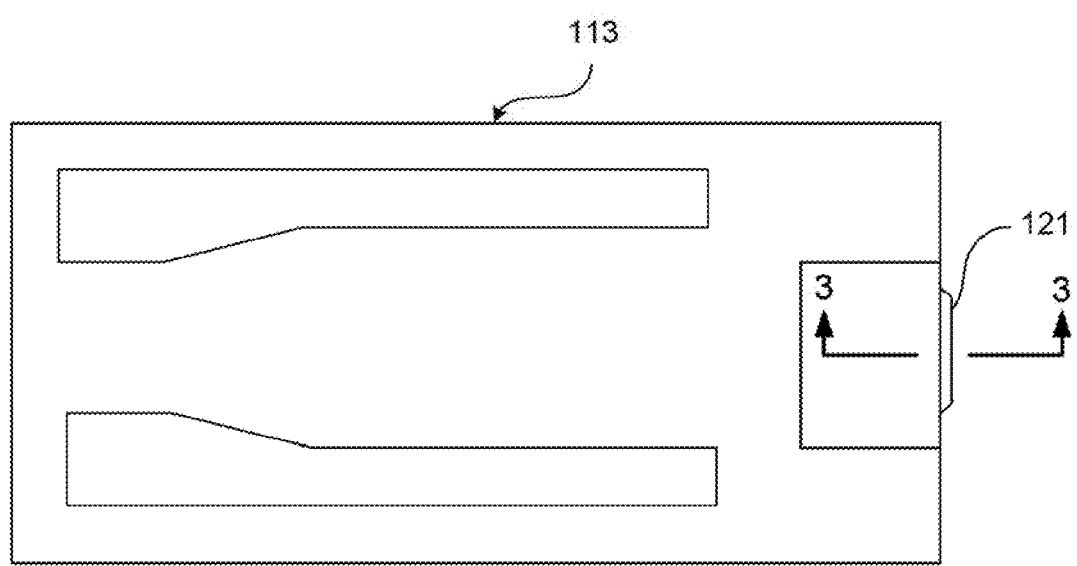
FIG. 2 is an ABS view of a slider, taken from line 2-2 of FIG. 1, illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system and the accompanying illustration of FIG. 1, are for representation purposes only. It should be apparent that disk storage systems may contain a large number of disks and actuators, and each actuator may support a number of sliders.

Figure 3:
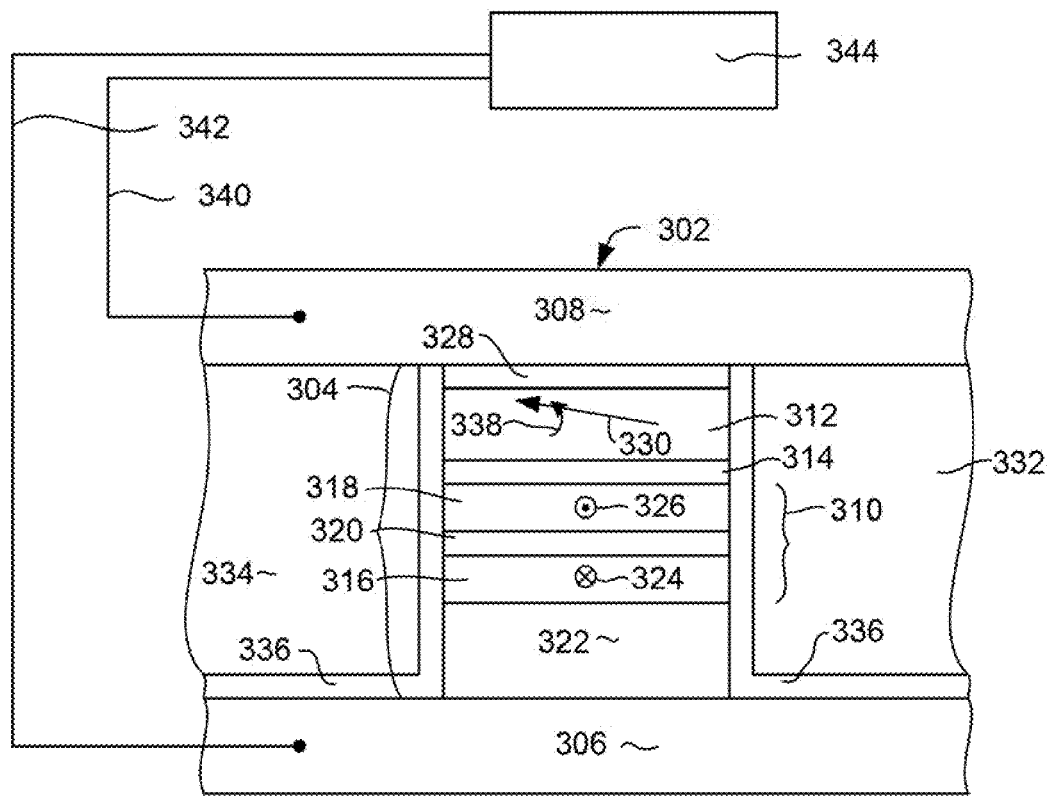
FIG. 3 is a schematic ABS view of a sensor according to an embodiment of the invention.
Figure 4:
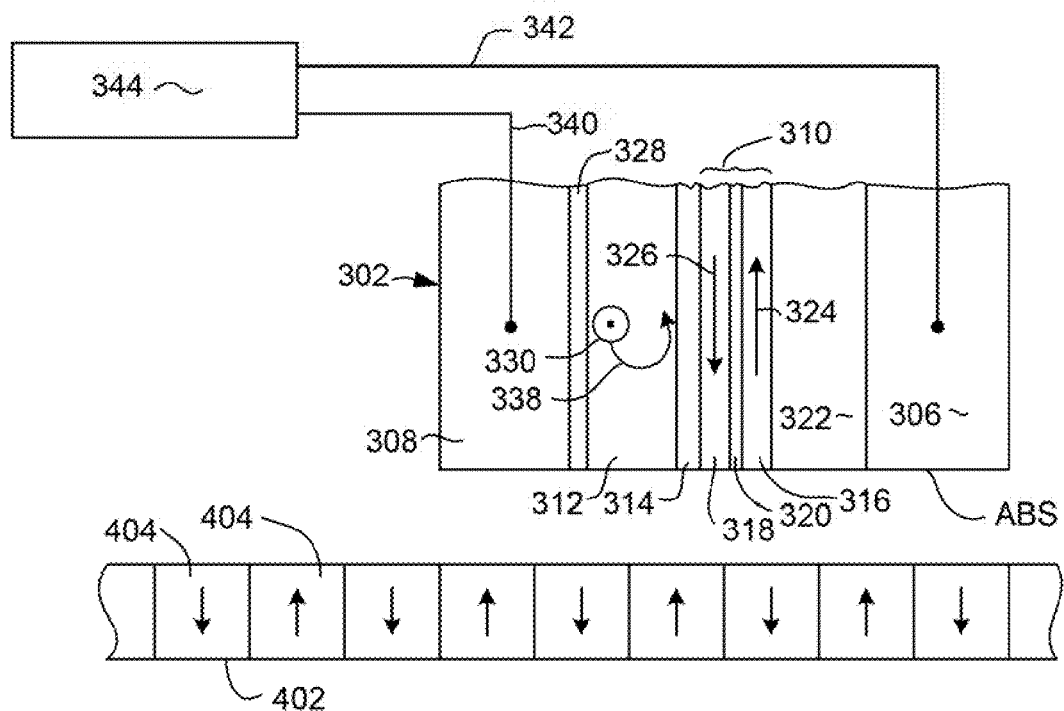
FIG. 4 is a side cross sectional schematic view of a the sensor of FIG. 3 shown relative to an adjacent magnetic medium.

With reference now to FIGS. 3 and 4 a magnetoresistive sensor 302 is shown that can take advantage of spin torque oscillations to sense a localized magnetic field. FIG. 3 shows the sensor 302 as viewed from the air bearing surface (ABS). FIG. 4 shows a side cross sectional view of the sensor 302 and also shows a magnetic medium 402 with recorded magnetic transitions of "bits" 404.

The magnetoresistive sensor includes a sensor stack 304 that is sandwiched between first and second magnetic shields 306, 308 that can be made of an electrically conductive, magnetic material such as NiFe so that they can function as electrical leads as well as magnetic shields. The sensor stack includes a pinned layer structure 310, a free layer 312 and a non-magnetic layer 314 sandwiched between the free layer 312 and the pinned layer structure 310. The non-magnetic layer 314 can be a non-magnetic, electrically conducting spacer layer such as Cu or could be a thin, non-magnetic, electrically insulating barrier layer. A capping layer 328 such as Ta can be formed over the top of the sensor stack 304.

The pinned layer structure can include a magnetic pinned layer 316, a reference layer 318 and a non-magnetic antiparallel coupling layer 320 sandwiched between the pinned layer 316 and the reference layer 318. The pinned and reference layers 316, 318 can be constructed of a material such as CoFe and the antiparallel coupling layer 320 can be constructed of a material such as Ru having a thickness of about 10 Angstroms. The pinned magnetic layer 316 can be exchange coupled with a layer of antiferromagnetic material AFM layer 322, which can be a material such as IrMn, PtMn or some other suitable antiferromagnetic material. Exchange coupling between the AFM layer 322 and the pinned layer 316 strongly pins the magnetization of the pinned layer in a first direction perpendicular to the ABS as indicated by arrow tail symbol 324. Strong antiparallel coupling between the pinned and reference layers 316, 318 pins the magnetization of the reference layer in a second (antiparallel) direction that is perpendicular with the ABS as indicated arrow head symbol 326.

In one embodiment, the free layer 312 has a magnetization that is biased generally parallel with the ABS as indicated by arrow 330. Biasing can be provided by first and second hard magnetic bias layers 332, 334 that can be arranged at either side of the sensor stack 304. The bias layers 332, 334 are separated from the sensor stack 304 and from at least one of the leads 306 by insulation layers 336. Alternative embodiments can include the free layer oriented in other directions, such as generally perpendicular to the ABS.

When a high current density of spin-polarized electrons generated by one magnetized layer impinges upon a second magnetized layer, spin torque effects are observed which dynamically excite the second layer's magnetization through a mechanism called spin transfer, as described by J. C. Slonczewski, JMMM 159, LI 1996. Here, electrons traveling through the ferromagnet tend to have their spin aligned parallel to the magnetization of the ferromagnet, losing any component of spin angular momentum transverse to the magnetization. To conserve angular momentum, the polarized current must then exert a torque upon the magnetization. For example, in the case shown in FIGS. 3 and 4 with electrons flowing from the reference layer 318 through the non-magnetic layer 314 to the free layer 312, the spin of the electrons flowing through the reference layer 318 are polarized by the magnetization 326 of the reference layer 318. These polarized electrons can then apply a torque to the free layer magnetization 312, generating spin waves that result in chaotic magnetization dynamics (noise) or collective excitations (oscillations), depending on various parameters of the system such as sensor shape, anisotropy, layer materials and thicknesses, and applied currents and magnetic fields.

Spin torque induced noise is undesirable in sensors, and efforts have been made to reduce or eliminate it. In contrast, spin torque oscillations have been considered as possible sources of microwaves for communication applications, for example as discussed by W. H. Rippard et al., PRL 92 027201 (2004). These oscillations involve spin torque excited precession of the magnetization along the equilibrium axis of the ferromagnet. For example, with reference to FIGS. 3 and 4, the precession, or oscillation of the magnetization 330 is indicated by arrow 338. Note that although the pinned layer magnetization is constrained by exchange anisotropy to an antiferromagnetic layer, it is possible for the magnetization of the pinned layer to also oscillate and contribute to the sensor signal when the applied current densities are high enough to generate spin torque excitations in the pinned layer.

It has been found that the frequency of this precession (oscillation frequency) shifts with the application of a magnetic field (S. I. Kiselev et al., Nature 425, 380 (2003), W. H. Rippard et al., PRL 92 027201 (2004)). For the proper choice of sensor materials and geometry, this shift can be very large. Frequency shifts up to 180 GHz/T have been demonstrated and higher values are possible (N. Stutzke, et al APL 82, 91 (2003)) (O. Boulle et al., Nature Phys. 3, 492 (2007)). The present invention takes advantage of these frequency shifts to detect the change in magnetic field at the free layer 338 induced by the magnetic bits of a magnetic recording medium.

With this in mind, the sensor 302 is connected via leads 340, 342 to processing circuitry 344. The leads 340, 342 can be connected with the shield/lead layers 306, 308, such that one lead 340 is connected with one lead/shield layer 308, while the other lead 342 is connected with the other lead/shield layer 306. The processing circuitry 344 sends a sense current through the sensor stack 304, and also measures the electrical resistance across the sensor stack 304. As those skilled in the art will appreciate, the electrical resistance across the spacer or barrier layer 314 changes as the orientation of magnetization 330 of the free layer changes 312 relative to the magnetization 326 of the reference layer 316. The closer these magnetizations 330, 326 are to being parallel the lower the electrical resistance will be. Conversely, the closer these magnetizations 330, 326 are to being anti-parallel the higher the electrical resistance will be.

With reference to FIG. 4, the magnetic transitions 404 of the magnetic medium 402 cause the above described change in the frequency of the oscillation 338 of the magnetization 330. As the magnetization 330 oscillates, the frequency of this oscillation can be measured by the circuitry 344 by measuring the change of electrical resistance across the sensor stack 304. Therefore, the spin torque oscillation that was previously a major contributor to signal noise and a limiting factor in the reduction of sensor size for a standard GMR or TMR sensor is now advantageously utilized to measure the presence of a magnetic field at extremely small bit sizes.

For a spin torque oscillation 338 having a natural frequency of 20 GHz changing by 200 GHz/T, a 50 mT swing in field from the transition 404 in the magnetic medium 402 would result in an oscillation 338 frequency shift of 10 GHz, from 15 GHz to 25 GHz. At a data rate of 1 Gbit per second, the spin torque oscillator would precess approximately 15 times over as the sensor passes over a recorded bit of one polarity and 25 times as the sensor passes over a recorded bit of the opposite polarity.

The signal and signal to noise ratio for the spin torque oscillator 302 can be compared to a similar sensor operated as in conventional GMR mode. It can be assumed that the amount of Additive White Gaussian Noise (AWGN) and peak to peak signal amplitude can stay the same. One can then expect a 6 dB signal to noise ratio advantage purely from the greater efficiency of the spin torque oscillator 302 as compared with a conventional GMR sensor.

In the preferred embodiment of the STO sensor, as the applied flux is swept from most negative to most positive, the spin torque oscillator is swept across a range of frequencies greater than the bandwidth of the flux signal itself. This wideband modulation of the STO by the flux makes the system more robust to perturbations due to Johnson noise and magnetic noise. Provided that the STO is swept across at least a bandwidth of 2 Fb/π, where Fb is the data rate of the system, the net head and electronics noise in the demodulated signal will be smaller than the noise due to the same sources in a conventional GMR sensor of similar design.

As the modulation of the STO increases further, the net head and electronics noise in the demodulated signal decreases. Since frequency modulated systems typically use phase detection systems, there are important practical limitations to how much the STO frequency can be modulated. One important consideration is that as the modulation depth (defined as the ratio of the frequency range to the maximum frequency) is increased, the bandwidth of the signal at the input to the phase detector must be correspondingly increased and thus the SNR at the input to the phase detector decreases. At very low SNR, noise at the input to the phase detector may be sufficient to change the sign of the overall signal. This sign change is interpreted by the phase detector as a 180 degree phase change and produces a very large noise pulse at the output of the phase detector. In practice, the noise power at the input to the phase detector must be maintained at least 5 times smaller than the signal power in order to keep the probability that the sign will change smaller than 1e-6. In a well designed system, the modulation of the STO will be sufficient to ensure that the effects of Johnson noise and magnetic noise are negligibly small compared to phase noise in the STO, while not being so great as to allow noise to flip the signal polarity at the input to the phase detector.

Additionally, by increasing the anisotropy of the resonating free layer 312, one can expect an even bigger improvement in signal to noise ratio, due to the stiffer free layer 312, which will also reduce thermal fluctuations of the magnetization 330 greatly reducing magnoise. To further illustrate the performance advantage of the spin torque oscillator 302, assume a typical track of recorded bits in which T50=T, where T50 refers to the time required for the flux to rise from the 25% to 75% of its full range and T refers to the time required to read or write a bit. Comparing a conventional. GMR sensor reading a long magnet with the same sensor reading an embedded data bit to a spin torque oscillator reading the same two data sets, the mean square difference between the two read signals using the spin torque oscillator is about 4 times as great as the mean square difference between the read signals using the conventional GMR sensor.

One can estimate the signal to noise ratio expected from the spin torque oscillator 302 and compare it with a conventional GMR sensor. The signal to noise ratio of prior art GMR sensors has been in the range of about 27 to 33 dB. Sensor SNR requirements are likely to remain this high or even increase to 35 dB as recording enters the TB/in² regime. Signal to noise ratio in a magnetoresistive sensor is defined as $SNR=10 \text{Log}_{10}(\text{Signal}_{(0-p)}^2/\text{noise power})$, where $\text{Signal}_{(0-p)}$ is base-to-peak signal. With the spin torque oscillator sensor 302, the base-to-peak signal power is determined by the amount of frequency modulation one can expect from the maximum media field. The noise power is determined from the mean-squared fluctuation in the frequency.

Assuming the spectral line is Gaussian, then the FWHM is approximately 2.35sigma and a 30 dB signal to noise ratio would roughly correspond to a line width to modulation depth ratio of about 13:1, while 40 dB would correspond to a ratio of 42:1. This would mean that to achieve 40 dB with modulation of plus or minus 5 GHz depth one would need a line width less than 234 MHz. With modulation of plus or minus 250MHz, the line width would have to be less than 12 MHz. There are two sources of phase noise contributing to spectral line width, both arising from thermal fluctuations: these are fluctuations along and perpendicular to the motion of the spin (velocity noise and angle noise). The velocity noise is given by $\Delta f_L = (4\pi\lambda\gamma\alpha k_B T n^2)/(M_s V D^2)$, where $\gamma$ is the gyromagnetic ratio, $\alpha$ is the Gilbert damping parameter, $K_B$ is Boltzmann's constant, $M_s$ is the magnetization, V is the volume, D is the degree of precession on the unit sphere, and n is the mode index. For typical materials at room temperature, this is about 24 MHz, much less than the line width required to achieve high SNR if the STO modulation depth is 5-10 GHz.

Angle noise is given by $\Delta f_i = n(df/d\theta)\Delta\theta$, where estimates of the value of $df/d\theta$ are approximately 35 MHz/degree for a typical material and device (J. Sankey et. Al, Phys. Rev B 72, 224427 (2005)). One can estimate the angle fluctuation from thermal excitation of a static spin system in a thermal bath. Such a very rough estimate of the expected change in precession angle thermal effects is presented here. The energy of the system can be estimated as $E(\theta)=KM_s V(\sin\theta)^2$, where $\theta$ is the angle at which the magnetization rotates from its equilibrium position, which is not exactly a fluctuation from the precession orbit, but close enough for this estimate, $M_s$ is the magnetization and K is the anisotropy. Putting this into an Arrhenius law expression and using $(\sin\theta)^2$ equal to $\theta^2$ for small angles, the probability of finding the magnetization at an angle $\theta$ away from its equilibrium is a Gaussian with a mean of 0 and a standard deviation of $[\text{sqrt}(k_B T/2E_0)]$, where $E_0$ is the energy corresponding to the mean fluctuation angle $\theta_0$. Note that the energy barrier E0 is approximately $E(\pi/2)=KM_s V/2$.

For sensors of several different sizes, one can estimate the fluctuation angle corresponding to several energy barriers (expressed in eV or in anisotropy field):

| Size (nm) | E0(eV) energy barrier | Anisotropy Field (Oe) | Fluctuation angle (deg) | Frequency fluctuation (MHz) |
|---|---|---|---|---|
| 40 × 120 × 5 | 6.7 | 1000 | 2.5 | 87 |
| 40 × 120 × 5 | 13.4 | 2000 | 1.75 | 61 |
| 20 × 30 × 5 | 0.8 | 1000 | 7 | 245 |
| 20 × 30 × 5 | 1.7 | 2000 | 4.9 | 171 |

One can find that for sensors with sizes likely to be used at TB/in² or higher data densities, the likely frequency fluctuations would be about 200 MHz. By the considerations above, this angle noise contribution to the frequency noise will dominate. Based on this estimate, the overall system signal to noise ratio would be about 40 dB for a sensor with frequency modulation of 10 GHz. The frequency dependence of frequency angle $df/d\theta$ depends on the materials and shape of the sensor, so there is room to improve this term to further increase SNR or to reduce the frequency (and therefore current) at the operating point of the sensor.

By choosing a free layer with higher anisotropy, one can greatly reduce the magnetic noise (mag-noise) so that the velocity and angle noise of the precessing magnetization will dominate the noise. In particular, the noise power from the mag-noise is: $P_{magnoise} \approx k_B T P R_P (\Delta R/R)^2 \alpha / H_{stiff} 2\gamma M_s^2 D^2 T_{free}$, where $k_B$ is Boltzmann's constant, T is temperature, P is the power dissipated by the sensor, $R_p$ is the sensor resistance, $\Delta R/R$ is the magnetoresistance, $\alpha$ is the Gilbert damping constant, $H_{stiff}$ is the stiffness field of the sensor (including uniaxial and shape anisotropies), $\gamma$ is the gyromagnetic ratio, $M_s$ is the saturation magnetization, D is one side of the sensor, and $t_{free}$ is the free layer thickness. Thus, a 3-fold increase in the anisotropy will result in a nearly 10-fold decrease in mag-noise.

Figure 7:
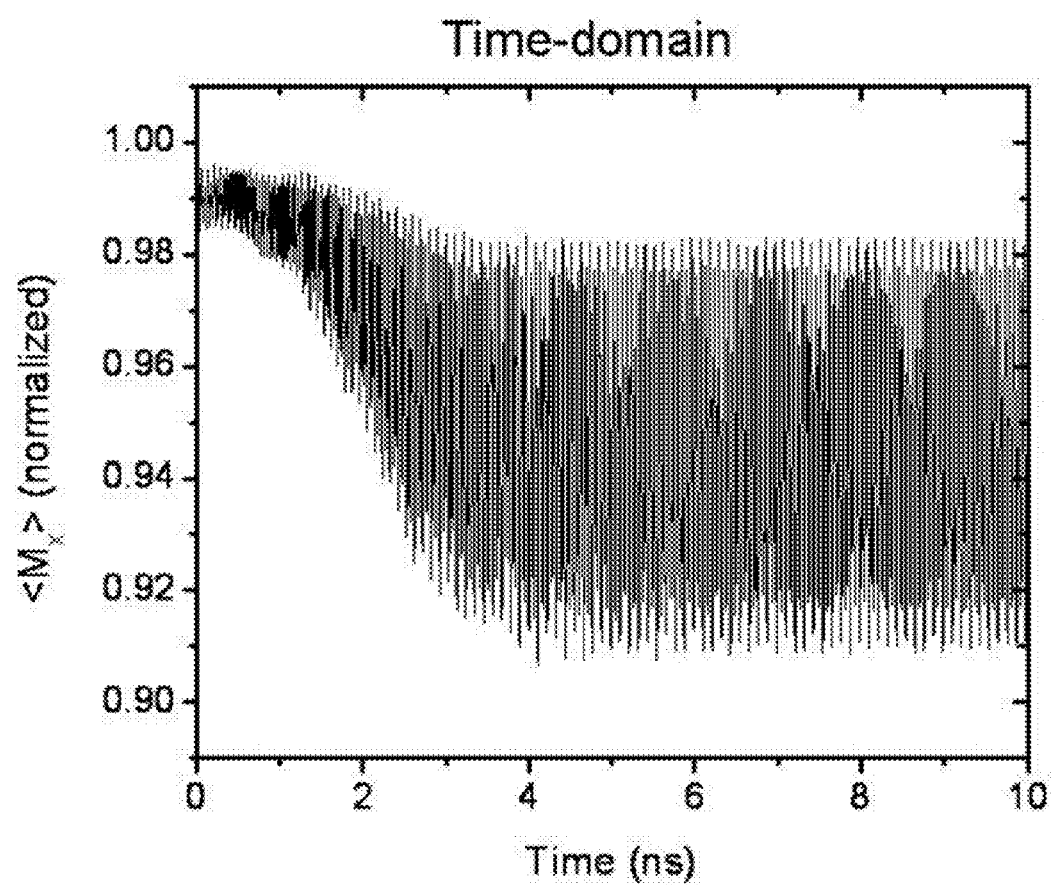
FIG. 7 is a simulated time domain graph of free layer magnetization vs. time for a typical spin valve structure with the application of a constant magnetic field.
Figure 8:
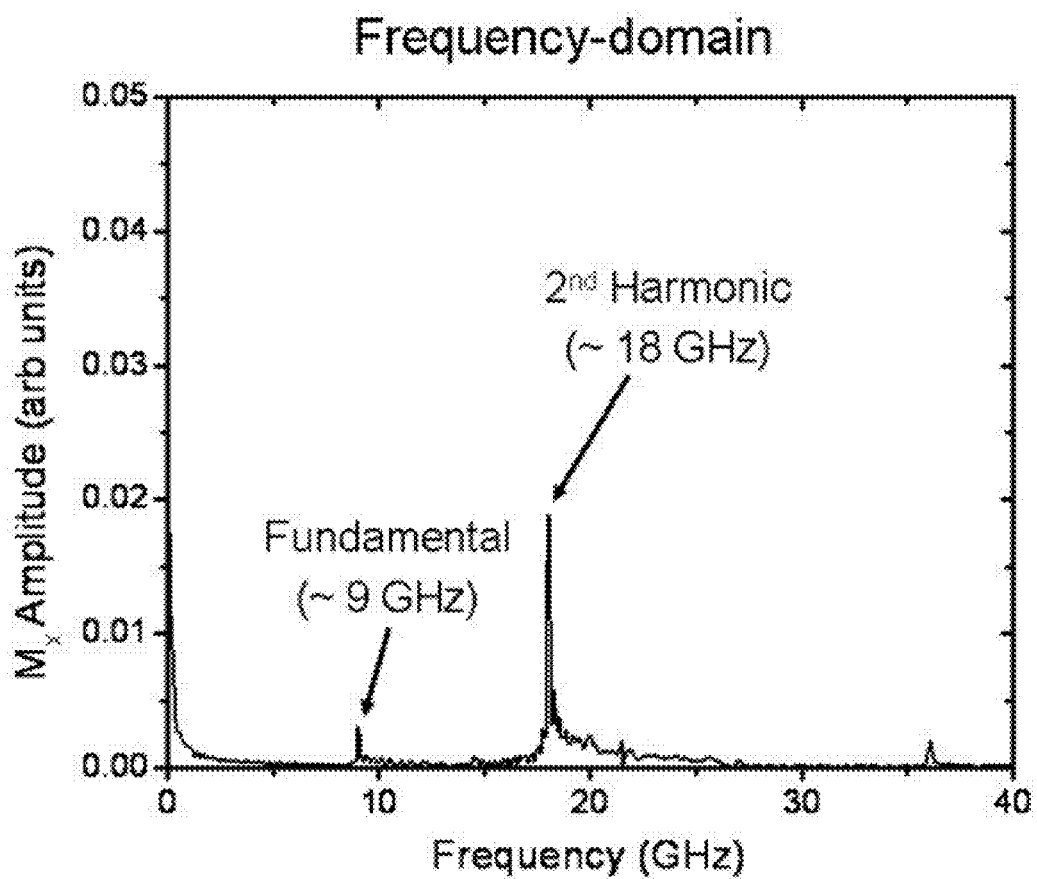
FIG. 8 is a frequency domain graph of free layer magnetization vs. time transformed from FIG. 7.

To illustrate aspects of the invention, one can consider several simple magnetic systems. FIGS. 7 and 8 illustrate how spin torque can excite steady state magnetization precession. The graphs of FIGS. 7 and 8 simulate a 40 nm by 120 nm by 5 nm thick elliptical nanomagnet under the influence of spin torque exerted by a spin polarized current with a current density of 5E7 A/cm² and a time-invariant 100 Oe magnetic field oriented along the long axis of the ellipse. After an initial brief period of time during which the magnetization oscillation amplitude (the graph of FIG. 7 plots the x component of magnetization) rings up, a steady state precession is reached which, when fast Fourier transformed, exhibits the clear spectral peaks at well defined frequencies shown in FIG. 8.

One drawback to the above described spin torque oscillator is that the pinned layer structure 310 and pinning AFM layer 322 consume a large amount of the gap budget (i.e. distance between the shields 306, 308). In the push for ever smaller bit sizes, it is necessary to greatly reduce this gap in order to decrease the length of a bit of data and thereby increase data density. The above described spin torque oscillation sensor is limited to thicknesses similar to those for conventional GMR or TMR sensors. The sensor stack cannot reasonably be made thinner than about 20 nm. At areal densities above 1 Tb/in² the gap will have to be smaller than 20 nm and it would be desirable to construct a sensor that can scale to a gap of about 10 nm or less in thickness.

Figure 5:
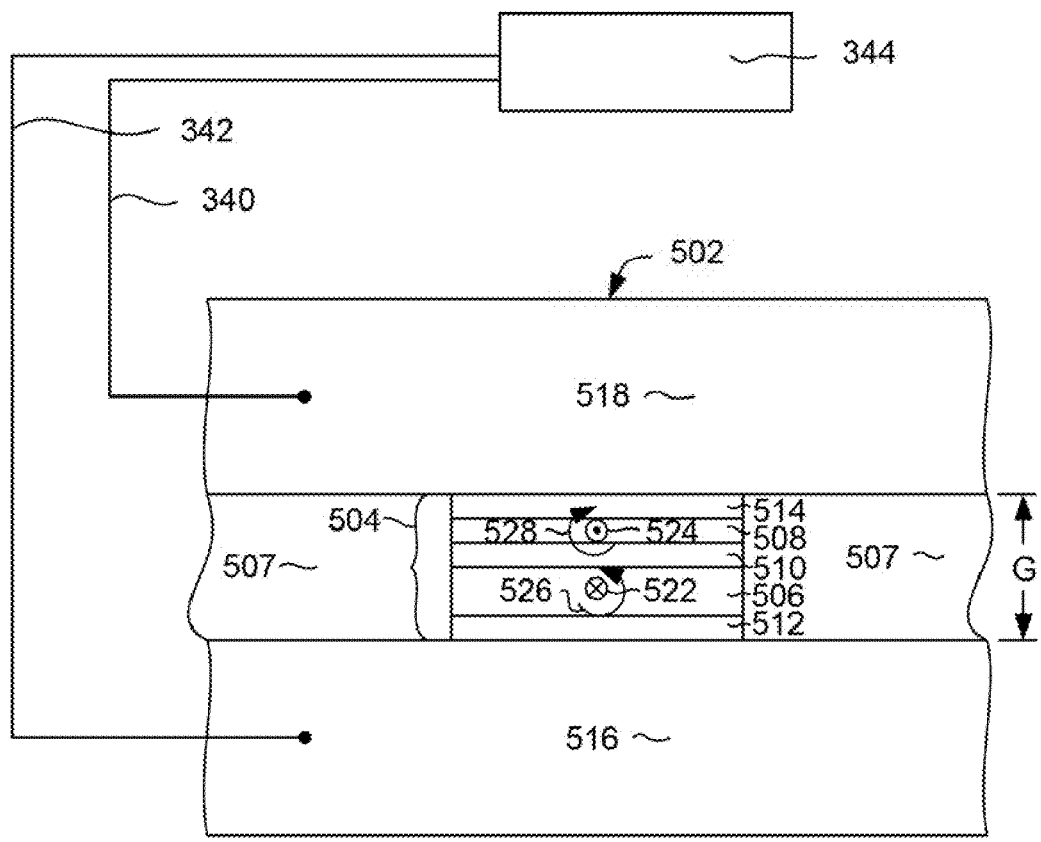
FIG. 5 is a schematic ABS view of a sensor according to another embodiment of the invention.
Figure 6:
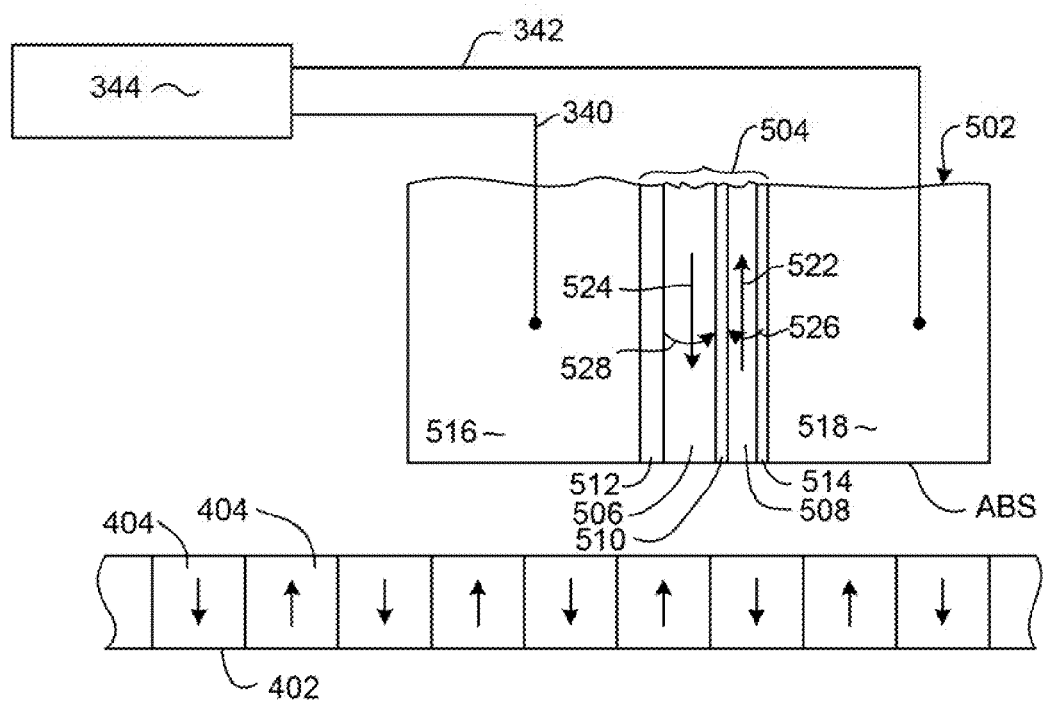
FIG. 6 is a side cross sectional schematic view of the sensor of FIG. 5 shown in relative to an adjacent magnetic medium.

FIGS. 5 and 6 illustrate a spin torque oscillation sensor according to an embodiment of the invention that can achieve such small gap thicknesses, because the above described. AP coupled pinned layer structure and thick. AFM pinning layer (310, 322 in FIG. 4) are eliminated. FIG. 5 shows a spin torque oscillation sensor 502 having a sensor stack 504 that includes first and second free layers 506, 508 that are separated from one another by a thin antiparallel coupling layer 510. The sensor stack 504 may also include a seed layer structure 512 at the bottom of the sensor stack, which can be provided to ensure a desired crystalline structure in the above formed layers, and a capping layer such as Ta 514 at the top of the sensor stack to protect the other layers of the sensor stack during fabrication.

The sensor stack 504 is sandwiched between first and second magnetic shields 516, 518 that are constructed of an electrically conductive material so that they can function as electrically conductive leads as well as magnetic shields. The distance between the magnetic shields 516, 518 defines a read gap G, which in turn defines the length of a bit of data that can be read by the sensor. The area between the shields 516, 518 outside of the sensor stack 504 can be filled with a non-magnetic fill layer 507 such as alumina.

With continued reference to FIG. 5, the antiparallel coupling layer 510 is very thin, being of such a thickness as to strongly antiparallel couple the two free layers 506, 508. The antiparallel coupling layer 510 can be constructed of a material such as Ru, Cu, Ir or some other suitable non-magnetic conducting material that can provide antiparallel coupling. The thickness of the antiparallel coupling layer 510 can be anywhere between 2 to 8 Angstroms. However, the desired thickness depends upon the material used for the layer 510. Additionally this layer should be electrically conducting and have sufficiently low spin scattering (as may arise from spin orbit scattering) that the polarization of current from one layer arriving at the other is not substantially reduced. The magnetic free layers 506, 508 can be constructed of a magnetic material such as CoFe, Co, NiFe or a combination of these materials, or any other suitable free layer for GMR and TMR magnetoresistors known in the art. In order to achieve magnetic oscillations in this antiferromagnetically coupled system, it is desirable that one of the magnetic layers 506 have a larger magnetic moment than the other magnetic layer 508. Magnetic moment can be defined as the product of the physical thickness of a magnetic layer multiplied by the saturation magnetization of the material making up that layer. By way of example, the magnetic layers 506, 508 can be constructed of the same or similar magnetic materials, with one layer 506 having a physical thickness of about 4 nm and the other layer 508 having a physical thickness of about 2 nm (ie. one layer can be about twice as thick as the other, yielding about twice the magnetic moment.)

As mentioned above, the magnetic layers 506, 508 are antiparallel coupled to have magnetizations 522, 524 that are oriented in opposite directions (i.e. antiparallel with one another). The magnetic layers 506, 508 can be constructed so that they have a magnetic anisotropy oriented perpendicular to the air bearing surface ABS when in a quiescent state, although other orientations will also work. This can be seen in FIG. 5 and more particularly in FIG. 6.

The magnetic sensor 502 can be connected with processing circuitry 344 via lead lines 340, 342, which connect the processing circuitry 344 with the shields/leads 516, 518. The circuitry passes a sense current through the sensor stack 504 in a direction perpendicular to the plane of the layers. This current causes the magnetizations 524, 526 to oscillate as a result of spin torque forces acting upon the magnetizations of the layers 506, 508. These spin torque induced oscillations are indicated by curved arrows 526, 528 in FIGS. 5 and 6. These oscillations occur as described above, moving in a precessional or conical manner as describe earlier above. Also as described above, this precessional oscillation occurs at a frequency that varies in response to a magnetic field.

In contrast to the previously described embodiment, however, the magnetizations of both of the antiparallel coupled magnetic layers oscillate at the same time. While the layers 506, 508 are antiparallel coupled, their magnetizations oscillate in a scissor fashion relative to a plane that is parallel with the coupling layer 510 Therefore, during this oscillation, the magnetizations 524, 526 move in and out of being antiparallel with one another. This causes a change in resistance across the sensor stack 504 that has a frequency that responds to a magnetic field and adjacent magnetic field. The scissor like motion in which the magnetization of both layers moves significantly is very much different than that of previously described STO sensors in which the free layer motion is large and the pinned layer magnetization is substantially motionless.

By way of example, if the sensor is used in a data recording system such as that described above with reference to FIG. 1, there would be a magnetic medium 402 adjacent to the ABS surface of the sensor 502. This magnetic media can be written with magnetic transitions 404 that can be oriented substantially perpendicular to the magnetic media as shown. As each magnetic bit 404 pass by the sensor stack 504, the frequency of the oscillations 526, 528 changes in response to the magnetic field form the media, and this change in oscillation frequency can be detected by the circuitry 344 as a change in the frequency of the resistance change across the sensor stack 504.

A major advantage of the presently described embodiment of the invention is that the gap thickness G is greatly reduced as compared with a pinned layer structure and an AFM pinning layer. As those skilled in the art will appreciate, in order for an AFM layer to function as a pinning layer it must be very thick relative to the other layers. Therefore, by constructing a spin torque sensor as described above with reference to FIGS. 5 and 6, the sensor can be made with a gap G of only about 7-9 nm compared with a gap thickness of 20 nm or greater for a conventional GMR or TMR sensor or compared with the spin torque sensor described above with reference to FIGS. 3 and 4.

Figure 9:
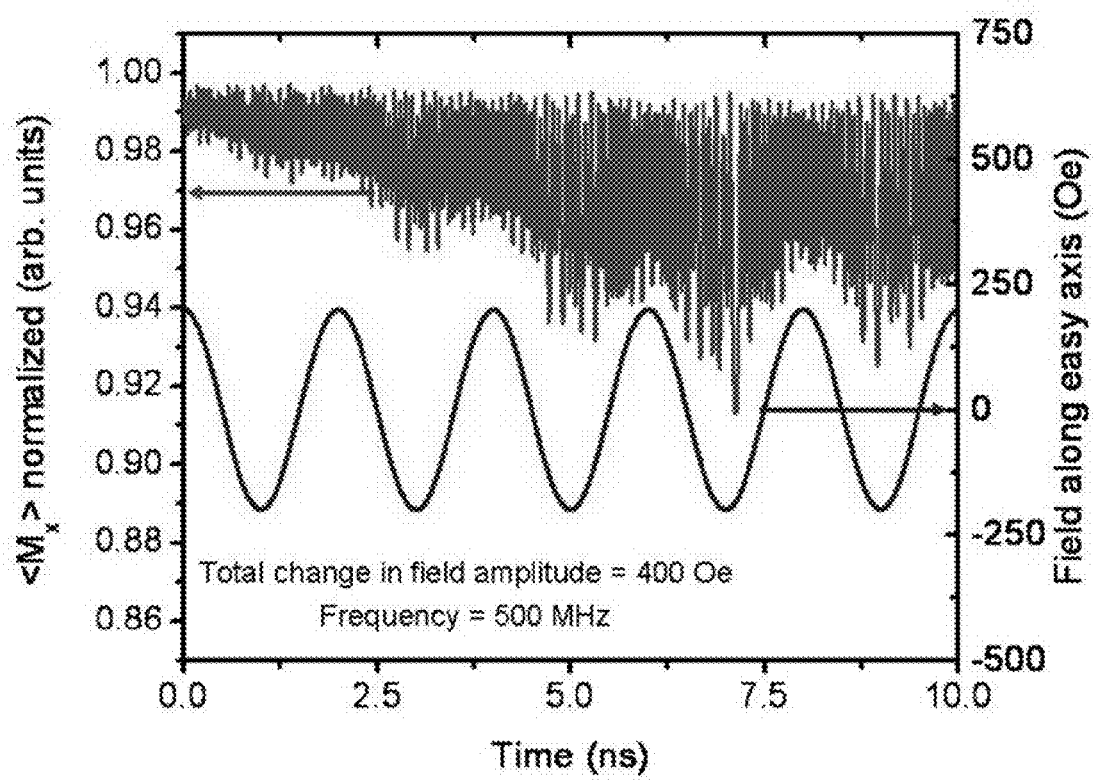
FIG. 9 is a graph showing the simulated response of the free layer magnetization oscillation to variations in external magnetic field amplitude for the same structure shown in FIGS. 7 and 8.

In the graph of FIG. 9, the DC field of the above example is replaced by an AC magnetic field (400 Oe peak-to-peak) to model the response of a spin torque oscillation sensor excited by hard drive media. Here, the precessing layer is assumed to have an anisotropy field of 1000 Oe. One can see that persistent magnetization oscillations can be generated for excitation fields typical of magnetic media. Furthermore, since the natural frequency of these oscillations (on the order of 10 GHzs or larger) are much higher than the 500 MHz AC field frequency, achieving a significant number of measurement cycles in one data period is not an issue.

Focusing on the times where the field is swept most positive or negative, one can see a distinct and measurable response to the excitation field, in both precession frequency and amplitude. By measuring the period in both of these regions, one can obtain a frequency shift in the spin torque oscillator of about 3.5 GHz between positive and negative peaks. Note that if detection is by GMR or TMR type sensor structures, whose resistance varies as the cosine of the angle between the magnetization of the precessing layer and the reference layer whose magnetization is fixed, then the signal frequency and frequency shifts are doubled with respect to the precession frequency.

Figure 10:
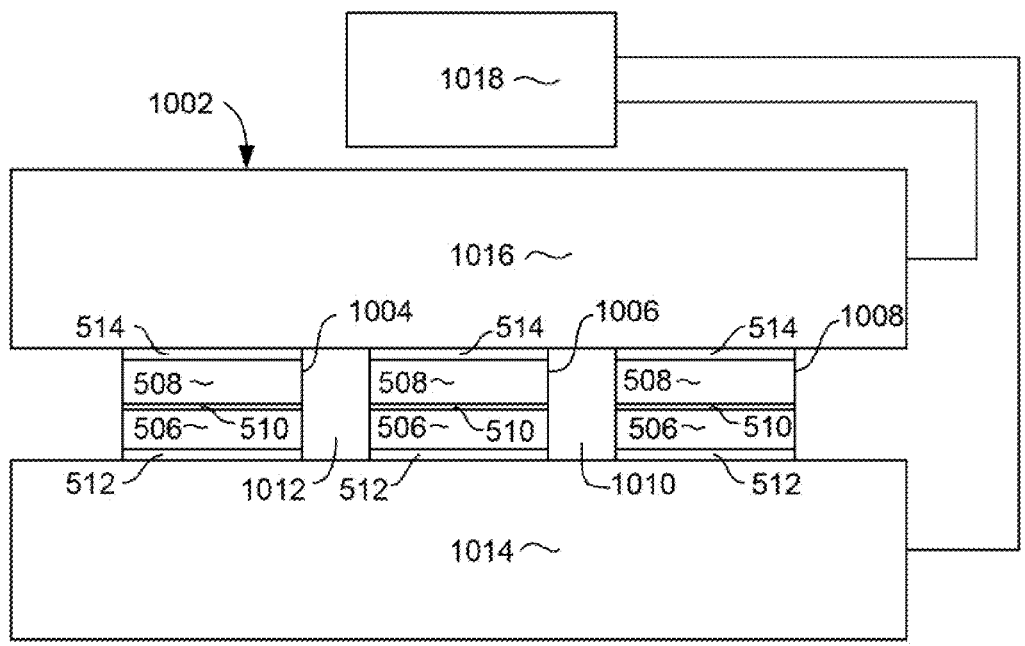
FIG. 10 is a schematic illustration of a spin torque oscillator multi-sensor structure according to an alternate embodiment of the invention.

FIG. 10 illustrates another embodiment of the invention. Adjacent track interference poses a serious challenge to the reading of data tracks at very high data densities (e.g. at very small track widths). One way to address this challenge is to construct a multi-sensor, wherein a central sensor reads the desired track and first and second sensors at either side of the central sensor are used to read adjacent track signals so that those signals can be cancelled out. However, in order for such a structure to be effective, the side sensors must be very close to the central primary sensor. If using a conventional sensor such as a GMR or TMR sensor, separate lead structures must be provided for each of the sensors. This makes the use of such a multi-sensor structure impractical in a functional read head. Lithographic patterning limitations limit the amount by which size and spacing of these leads can be reduced. In addition, the amount of available space (real estate) on a head is limited, such that the various leads for each of these sensors cannot fit onto the head.

The present invention, as illustrated with reference to FIG. 10 overcomes this challenge, making the use of a multi-sensor extremely practical. As shown in FIG. 10, a multilayer sensor structure 1002 includes multiple sensor stacks 1004, 1006, 1008. The sensor structure 1002 is shown in FIG. 10 as viewed in a plane that is parallel with the air bearing surface (ABS). Therefore, the sensor structure 1002 can include a central, primary sensor stack 1006 that is used to read a desired data track. The structure 1002 also includes first and second side sensors 1004, 1008 that can be used to sense adjacent data tracks. The sensor stacks 1004, 1006, 1008 can be separated by narrow gaps 1010, 1012 that can be filled with a non-magnetic insulating material such as alumina. The sensor structure also includes first and second leads 1014, 1016 that can be constructed of an electrically conductive magnetic material so that they can function as magnetic shields as well as electrical leads.

Each of the sensor stacks 1004, 1006, 1008 can be constructed in various manners to each form a magnetoresistive sensor unit. By way of example, each sensor stack 1004, 1006, 1008 can include magnetic layers 506, 508 separated by a thin antiparallel coupling layer 510, similar to the structure shown in FIGS. 5 and 6. Also, similar to the structure shown in FIGS. 5 and 6, the sensor elements 1004, 1006, 1008 can each include a seed layer 512, and a capping layer 514.

As mentioned above, prior art sensor structures required separate lead structures for each sensor stack, making multi-sensor structures practically impossible. The present invention, however, utilizes spin torque oscillation (as described above) to sense the presence of a magnetic field, thereby completely eliminating the need for separate lead structures.

As can be seen, each of the sensor stacks 1004, 1006, 1008 shares a common bottom lead 1014 and common upper lead 1016. Therefore, the sensors 1004, 1006, 1008 are connected in parallel with each other. Each sensor can be constructed so that it is tuned to a different natural harmonic oscillation frequency (in the absence of a magnetic field). This can be accomplished by adjusting the size, shape and or composition of the various layers of each sensor stack 1004, 1006, 1008.

Because each sensor stack 1004, 1006, 1008 has a different natural oscillation frequency, the signals from each sensor stack can be processed by circuitry 1018 that can process the signals from each of the sensor stacks 1004, 1006, 1008 from the common leads 1014, 1016. The circuitry can distinguish the signals from each of the sensor stacks 1004, 1006, 1008 based on their different natural oscillation frequencies.

Figure 11:
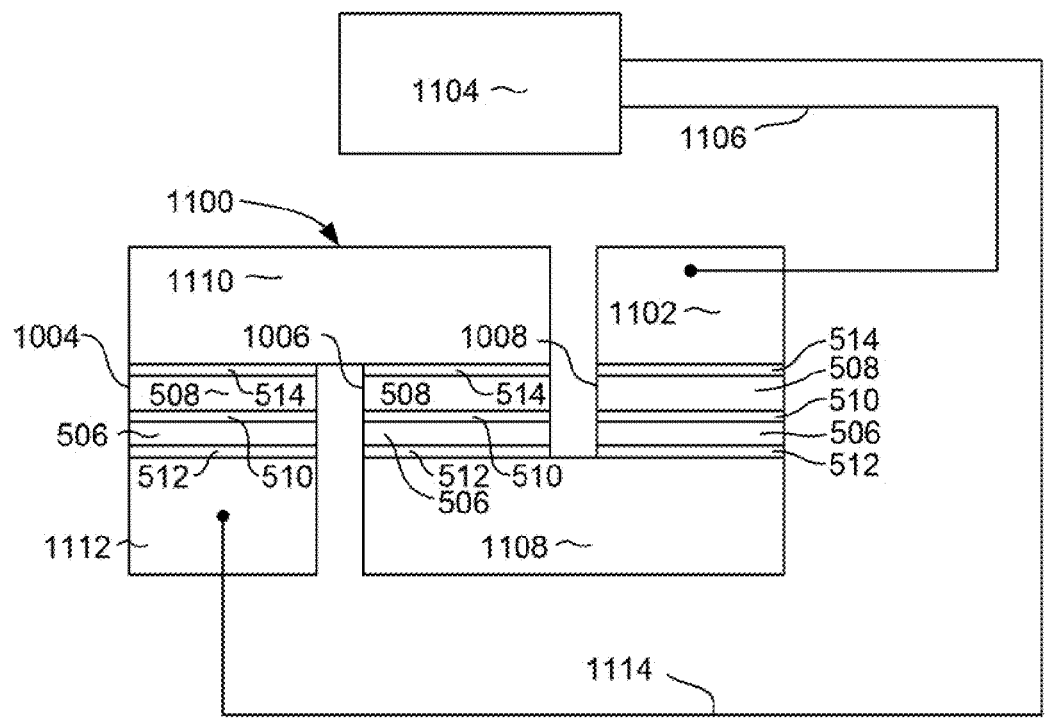
FIG. 11 is a schematic illustration of a spin torque oscillator multi-sensor structure according to another alternate embodiment of the invention.

FIG. 11 illustrates an embodiment of the invention wherein a plurality of sensor element can be connected in series electrically to mitigate adjacent track interference. The multi-sensor structure 1100 includes multiple sensor stacks 1004, 1006, 1008, which can be arranged side by side in a sensor array. The sensor stacks 1004, 1006, 1008 can be arranged such that the central sensor 1006 reads a desired data bit of interest and can be considered the primary sensor. The other sensor stacks 1004, 1008 can be arranged to read adjacent tracks.

One surface of one of the sensor elements (e.g. the top surface of sensor element 1008) can be connected with a first lead/shield layer 1102, which can be connected to processing circuitry 1104 via lead 1106. The other end of the sensor element 1008 (e.g. the bottom end) can be connected with a lead/shield layer 1108 that is also connected with an end of the middle sensor element 1006. The other end of the middle sensor element 1006 can be connected with a third lead/shield layer 1110 that is also connected with an end of the sensor element 1004. The other end of the sensor element 1004 can then be connected with a lead/shield 1112 that can be connected with the processing circuitry 1104 via lead layer 1114. While other embodiments having other connection schemes are also possible, the above described embodiment illustrates how the invention can be used to connect side by side sensor elements in series to read adjacent tracks.

The sensor stacks 1004, 1006, 1008 are connected in series via lead layers 1102, 1108, 1110, 1112 to processing circuitry 1104 that can distinguish and process the signals from each of the sensor stacks. As with the above example, the sensor stacks 1002, 1004, 1006 can be constructed so that each sensor stack has a unique natural spin torque oscillation frequency. In this way, the circuitry can distinguish the signal from each of the sensor stacks. The signal from the sensor stacks 1004, 1008 can be used to sense signals from adjacent tracks. The circuitry can then cancel out the signals from these adjacent tracks in order to eliminate adjacent track interference and isolate the signal from the desired track, read by the central sensor element 1006.

Additionally, STO sensor stacks with pinned layers (which generally have lower oscillation frequencies) can be combined with stacks embodying the present invention (which generally have higher oscillation frequencies) in multisensors having a wide range of operating frequencies.

It is also understood that this sensor can be incorporated as the detector in a scanning probe system for imaging the spatial distribution of magnetic fields, and also used as a sensor for the detection of magnetic structures combined with biological materials, as in an apparatus for counting magnetic beads tagged with biological molecules.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A spin torque oscillation magnetoresistive sensor comprising:
   a first magnetic layer;
   a second magnetic layer;
   a non-magnetic layer sandwiched between the first and second magnetic layers, the non-magnetic layer having a thickness to antiparallel couple the first and second magnetic layers; and
   circuitry for passing a sense current through the first and second magnetic layers and the spacer layer, the sense current causing spin torque induced oscillations in magnetizations of the first and second magnetic layers with the oscillations having a frequency that changes in response to the presence of a magnetic field.

2. The sensor as in claim 1 wherein circuitry is operable to measure the frequency of the oscillation.

3. The sensor as in claim 1 wherein the first and second magnetic layers have magnetizations that are opposite to one another in a quiescent state.

4. The sensor as in claim 1 wherein the first and second magnetic layers have magnetizations that are opposite to one another in a quiescent state, the magnetizations of the first and second magnetic layers being free to move in response to spin torque from electrons flowing therethrough.

5. The sensor as in claim 1 wherein the first and second magnetic layers are not magnetically pinned.

6. The sensor as in claim 1 where the magnetizations oscillate in precessions that form a scissoring motion with respect to each other.

7. The sensor as in claim 1 wherein the sensor has an air bearing surface and wherein the oscillations are in the form of precession about an axis that is perpendicular to the air bearing surface.

8. The sensor as in claim 1 wherein the sensor has an air bearing surface and wherein the first and second magnetic layers have magnetizations that are oriented opposite to one another and perpendicular to the air bearing surface in a quiescent state.

9. The sensor as in claim 1 wherein the oscillation of the magnetizations of the first and second magnetic layer are caused by spin torque induced by spin polarization of electrons traveling through the sensor stack.

10. The sensor as in claim 1 wherein the non-magnetic layer comprises Ru, Ir or Cu.

11. The sensor as in claim 1 wherein the non-magnetic layer has a thickness of 2 Angstroms to 8 Angstroms.

12. The sensor as in claim 1 wherein the sensor contains no antiferromagnetic material layer.

13. The sensor as in claim 1 wherein the first and second magnetic layers are free magnetic layers and are the only magnetic layers in the sensor.

14. The sensor as in claim 1 wherein the magnetic moment of the first magnetic layer is larger than the magnetic moment of the second magnetic layer.

15. The sensor as in claim 1 wherein the sensor contains no magnetic pinned layer structure.

16. A magnetoresistive multi-sensor array, comprising:
a plurality of sensor elements each of the sensor elements comprising a pair of antiparallel coupled free magnetic layers, the magnetic layers of each sensor having a natural magnetic oscillation frequency that differs from the natural oscillation frequency of the magnetic layers of the other sensor elements; and
circuitry connected with the sensor elements for supplying a sense current there-through, the sense current causing a spin torque induced magnetic oscillation in the magnetic layers of each of the sensor elements.

17. The magnetoresistive multi-sensor array as in claim 16 wherein the circuitry is operable to measure the oscillation frequency of the magnetic layers of each of the sensor elements.

18. The magnetoresistive multi-sensor array as in claim 17 wherein the circuitry is further operable to distinguish a signal from each of the sensor elements based on the difference in natural oscillation frequency.

19. The magnetoresistive multi-sensor array as in claim 16 wherein the sensor elements are electrically connected in series with one another.

20. The magnetoresistive multi-sensor array as in claim 16 wherein the sensor elements are electrically connected in parallel with one another.

21. A magnetoresistive multi-sensor array, comprising:
a plurality of sensor elements with both sensor elements comprising a pair of antiparallel coupled free magnetic layers and sensor elements comprised of free and pinned magnetic layers, the oscillating magnetic layers of each sensor having a natural magnetic oscillation frequency that differs from the natural oscillation frequency of the oscillating magnetic layers of the other sensor elements; and
circuitry connected with the sensor elements for supplying a sense current there-through, the sense current causing a spin torque induced magnetic oscillation in the magnetic layers of each of the sensor elements.

22. The magnetoresistive multi-sensor array as in claim 21 wherein the circuitry is operable to measure the oscillation frequency of the magnetic layers of each of the sensor elements.

23. The magnetoresistive multi-sensor array as in claim 21 wherein the circuitry is further operable to distinguish a signal from each of the sensor elements based on the difference in natural oscillation frequency.

24. The magnetoresistive multi-sensor array as in claim 21 wherein the sensor elements are electrically connected in series with one another.

25. The magnetoresistive multi-sensor array as in claim 21 wherein the sensor elements are electrically connected in parallel with one another.

* * * * *